(12) United States Patent
Chang et al.

(10) Patent No.: US 12,234,145 B2
(45) Date of Patent: *Feb. 25, 2025

(54) METHODS FOR WAFER BONDING

(71) Applicant: Taiwan Semiconductor Manufacturing Co., Ltd., Hsinchu (TW)

(72) Inventors: Chien-Wei Chang, Hsin-Chu (TW); Ya-Jen Sheuh, Hsin-Chu (TW); Ren-Dou Lee, Hsinchu (TW); Yi-Chih Chang, Hsin-Chu (TW); Yi-Hsun Chiu, Zhubei (TW); Yuan-Hsin Chi, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,545

(22) Filed: Nov. 18, 2023

(65) Prior Publication Data

US 2024/0190701 A1    Jun. 13, 2024

Related U.S. Application Data

(63) Continuation of application No. 16/695,673, filed on Nov. 26, 2019, now Pat. No. 11,851,325.
(Continued)

(51) Int. Cl.
*B81C 1/00* (2006.01)
*H01L 21/02* (2006.01)
(Continued)

(52) U.S. Cl.
CPC .... *B81C 1/00238* (2013.01); *H01L 21/02274* (2013.01); *H01L 21/31053* (2013.01); *H01L 22/12* (2013.01)

(58) Field of Classification Search
CPC ......... H01L 21/02274; H01L 21/31053; B81C 1/00238
See application file for complete search history.

(56) References Cited

U.S. PATENT DOCUMENTS 9,799,655 B1 * 10/2017 Cheng ............... H01L 21/76895
10,679,889 B2 * 6/2020 Tsai ..................... H01L 21/84
(Continued)

FOREIGN PATENT DOCUMENTS

CN      105590834 A     5/2016
JP      2002057132 A    2/2002
(Continued)

OTHER PUBLICATIONS

S. Kim, L. Peng, A. Miller, G. Beyer, E. Beyne and C. Lee, "Permanent wafer bonding in the low temperature by using various plasma enhanced chemical vapour deposition dielectrics," 2015 International 3D Systems Integration Conference (3DIC), Sendai, 2015, pp. TS7.2.1-TS7.2.4, doi: 10.1109/3DIC.2015.7334576.
(Continued)

*Primary Examiner* — Monica D Harrison
*Assistant Examiner* — Andre C Stevenson
(74) *Attorney, Agent, or Firm* — Duane Morris LLP

(57) ABSTRACT

Methods for improving wafer bonding performance are disclosed herein. In some embodiments, a method for bonding a pair of semiconductor substrates is disclosed. The method includes: processing at least one of the pair of semiconductor substrates, and bonding the pair of semiconductor substrates together. Each of the pair of semiconductor substrates is processed by: performing at least one chemical vapor deposition (CVD), and performing at least one chemical mechanical polishing (CMP). One of the at least one CVD is performed after all CMP performed before bonding.

20 Claims, 6 Drawing Sheets

Related U.S. Application Data

(60) Provisional application No. 62/773,668, filed on Nov. 30, 2018.

(51) Int. Cl.
*H01L 21/3105* (2006.01)
*H01L 21/66* (2006.01)

(56) References Cited

U.S. PATENT DOCUMENTS

| | | | |
|---|---|---|---|
| 11,851,325 B2* | 12/2023 | Chang | H01L 21/02274 |
| 2003/0224559 A1 | 12/2003 | Gross | |
| 2011/0024867 A1 | 2/2011 | Tseng et al. | |
| 2012/0258564 A1 | 10/2012 | Wang et al. | |
| 2013/0130473 A1 | 5/2013 | Ben Mohamed et al. | |
| 2017/0200648 A1* | 7/2017 | Lee | H01L 27/092 |
| 2017/0283254 A1 | 10/2017 | Rothberg et al. | |
| 2018/0265731 A1 | 9/2018 | Ekinaka et al. | |

FOREIGN PATENT DOCUMENTS

| | | |
|---|---|---|
| TW | 200802544 A | 1/2008 |
| TW | 1353670 B | 12/2011 |
| TW | 201436069 A | 9/2014 |

OTHER PUBLICATIONS

C. S. Tan and G. Y. Chong "Low Temperature Wafer Bonding of Low- K Carbon-Doped Oxide for Application in 3D integration" 2010 Electrochem. Solid-State Lett. 13 H27-H29.

Pierre-Emmanuel, T., "Silicon Fusion Bonding for Microfluidic application", Ecole Polytechnique Federale De Lausanne, Master 2015/2016 Semester Project, Oct. 6, 2016, pp. 1-35.

* cited by examiner

METHODS FOR WAFER BONDING

RELATED APPLICATIONS

This application is a continuation of U.S. patent application Ser. No. 16/695,673, filed Nov. 26, 2019, which claims priority to provisional application No. 62/773,668 entitled "METHODS FOR IMPROVING WAFER BONDING PERFORMANCE," and filed on Nov. 30, 2018, the entireties of each is incorporated by reference herein.

BACKGROUND

In the Micro-Electro-Mechanical Systems (MEMS) and micro-electronic fields, there is frequently a need for bonding wafers together for the purpose of encapsulating structures in vacuum cavities or in cavities with controlled atmosphere. Direct bonding, or fusion bonding, is a popular wafer bonding process without any additional intermediate layers. Surface roughness is a limiting factor in fusion bonding. For example, surface roughness requirement for silicon fusion bonding is significantly less than 1 nanometer. Following an existing method of fusion bonding, each wafer is pre-processed by chemical vapor deposition (CVD) and chemical mechanical polishing (CMP), where a CMP is used as the final process before the bonding. In this case, the grinding surface has a high roughness that does not meet the roughness requirement and is prone to bonding void and sensing plate peeling issue.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Figure 1:
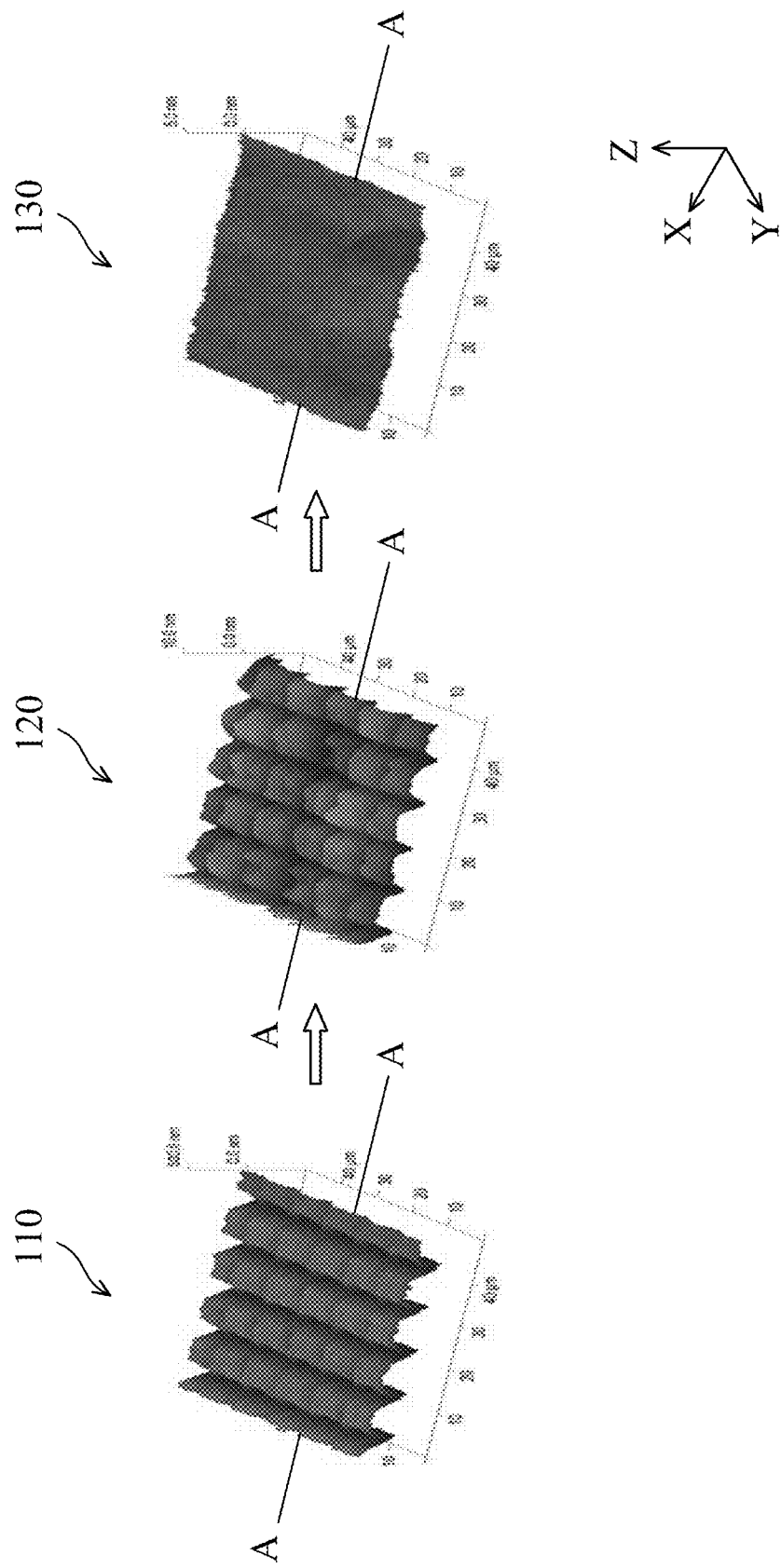
FIG. 1 illustrates perspective views of surface roughness changes during wafer processing for bonding, in accordance with some embodiments of the present disclosure.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Fusion bonding (also known as direct bonding) is a process for joining surfaces without intermediate layers. The process includes formation of chemical bonds between the surfaces when the surfaces are sufficiently flat, clean, and smooth. Fusion bonding has many applications in the semiconductor manufacturing industry, e.g. to package MEMS devices, such as accelerometers, pressure sensors, and gyroscopes, or to manufacture semiconductor substrates, such as silicon-on-insulator (SOI) substrates. It enables the formation of non-standard material stacks that are becoming increasingly important for various high performance microelectronic device applications. As the semiconductor industry faces fundamental challenges in device scaling, there is more impetus to explore alternative materials and device structures, and the flexibility afforded by wafer bonding can potentially affect several promising new technologies. For instance, three-dimensional (3D) integrated circuits (ICs) formed by wafer bonding will allow system designers greater possibilities for optimizing circuit performance and increasing circuit functionality. Stacking different semiconductors (e.g., GaAs and Si) by wafer bonding facilitates the monolithic integration of optical and electronic devices. Alternative substrates such as silicon-on-sapphire, which have high defect densities when formed by conventional heteroepitaxy, can be realized with much lower defect densities by wafer bonding and result in improved RF circuit performance. Fabrication of novel device structures such as double-gate metal-oxide-semiconductor transistors with improved performance and scalability can be aided by wafer bonding as well.

It is noted that for fusion bonding between dielectric layers, the surfaces are subject to a roughness requirement. A low roughness is helpful for silicon fusion bonding. Fusion bonding of silicon or silicon dioxide requires that both surfaces be highly polished and smooth. According to surface roughness requirements for fusion bonding, the root mean square (RMS) surface roughness value needs to be reduced to less than 1 nanometer (nm), typically less than size of two water molecules. In some embodiments, for general hydrophilic silicon surface, the RMS surface roughness is less than about 0.552 nm.

The present disclosure provides methods for improving wafer bonding performance. In one embodiment, following a disclosed method, a wafer substrate is pre-processed by alternatively performing processes of chemical vapor deposition (CVD) and chemical mechanical polishing (CMP), where a CVD process is performed after all CMP processes before bonding. In another embodiment, pre-processing the wafer for bonding includes: first repeating a cycle of performing CVD followed by CMP until a surface roughness of the wafer is smaller than a predetermined threshold, and then performing a CVD afterwards. This reduces the localized roughness and increases the reaction degree of the fusion bond reaction on the wafer. As such, the disclosed method can achieve a better bonding performance, and can provide a better and more reliable device yield compared to existing methods. The disclosed methods are applicable to a wafer bonding process during manufacturing of any semiconductor product, including but not limited to: pressure sensor, accelerator, CMOS image sensor, etc.

FIG. 1 illustrates perspective views of surface roughness changes during wafer processing for bonding, in accordance with some embodiments of the present disclosure. During a fusion bonding, two wafers may be bonded via dielectric layers. That is, their respective dielectric layers will be in direct contact to be bonded together. A dielectric layer may be formed by a deposition process, such as chemical vapor deposition (CVD) which may include plasma-enhanced CVD (PECVD), thermal CVD, high-density-plasma CVD (HDPCVD), etc. In one example, forming a dielectric layer may comprise growing an oxide layer over a semiconductor substrate. In another example, forming a dielectric layer may comprise growing an oxide layer over a metal line layer for metal protection. A dielectric layer may comprise any suitable composition and/or thickness. The CVD process may stop when the thickness of the dielectric layer reaches a certain degree, by controlling the deposition rate and/or time.

As shown in FIG. 1, a CVD process is performed at operation 110 on the wafer to be bonded, where a perspective view of the wafer surface shows a surface roughness after the CVD process. In this example, the wafer surface (i.e. the dielectric layer surface) after the CVD process 110 has a high surface roughness. In one embodiment, after the CVD process 110 the RMS surface roughness value of the bonding area of is from about 10 to about 100 nm.

After the dielectric layer is deposited, a chemical mechanical polishing (CMP) process is performed on the dielectric layer to etch back and planarize the dielectric layer. The CMP process may selectively stop when the thickness of the dielectric layer is reduced to a certain degree and at an etch stop layer. The CMP operation is implemented in order to achieve a lower roughness of the wafer surface. As shown in FIG. 1, a CMP process is performed at operation 120 on the wafer to be bonded, where a perspective view of the wafer surface shows a surface roughness after the CMP process is performed. In this example, the wafer surface after the CMP process 120 has a lower surface roughness than that of the wafer surface after the CVD process 110. In one embodiment, the CMP process can reduce the RMS surface roughness of the wafer to about 1 to 10 nm.

To further reduce the RMS surface roughness of the wafer, an additional CVD process is performed at operation 130 on the wafer to be bonded, where a perspective view of the wafer surface shows a surface roughness after the additional CVD process. In this example, the wafer surface after the additional CVD process 120 has a lower surface roughness than that of the wafer surface after the CMP process 120. In one embodiment, the additional CVD process 120 can reduce the RMS surface roughness of the wafer to less than 0.5 nm, e.g. 0.1 to 0.3 nm.

Figure 2:
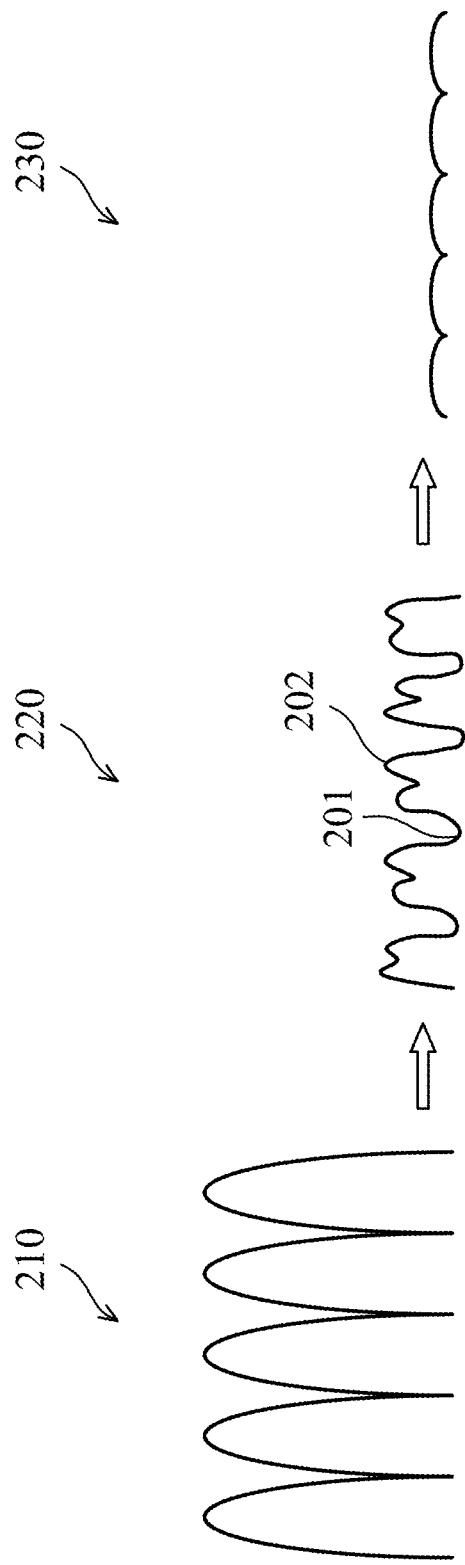
FIG. 2 illustrates cross sectional views of surface roughness changes during wafer processing for bonding, in accordance with some embodiments of the present disclosure.

The detailed mechanism of the surface roughness reduction during wafer processing before bonding is now described referring to FIG. 2. FIG. 2 illustrates cross sectional views of surface roughness changes during wafer processing for bonding, in accordance with some embodiments of the present disclosure. The wafer surface at operation 210 in FIG. 2 is a cross sectional view cut along the line A-A at the operation 110 in FIG. 1. The wafer surface at operation 220 in FIG. 2 is a cross sectional view cut along the line A-A at the operation 120 in FIG. 1. The wafer surface at operation 230 in FIG. 2 is a cross sectional view cut along the line A-A at the operation 130 in FIG. 1. While the cross sectional views in FIG. 2 are cut along the line A-A along the X direction in FIG. 1, the RMS surface roughness will count along other directions, e.g. the Y direction as well.

As shown in FIG. 2, the wafer first has a high surface roughness after the initial CVD 210, with a big difference between maintains (local maximums) and valleys (local minimums) on the wafer surface. Then the surface roughness is reduced significantly after the CMP process 220, with a less difference between maintains 202 and valleys 201 on the wafer surface, because the CMP process can etch back the deposited dielectric layer to planarize the dielectric layer. But when the RMS surface roughness is reduced to a certain level, the CMP process cannot reduce the RMS surface roughness any more, or it is very inefficient and ineffective for the CMP process to reduce the RMS surface roughness further. This is because the polishing pad of a CMP tool is typically made of a porous polymeric material. As such, a polishing pad may polish both the maintains 202 and the valleys 201 on the wafer surface. When the differences between maintains 202 and valleys 201 are high, i.e. when the RMS surface roughness is high, the polishing rate at the maintains 202 can be higher than the polishing rate at the valleys 201 during the CMP process, which results in a lower RMS surface roughness. But when the differences between maintains 202 and valleys 201 are low, i.e. when the RMS surface roughness is low, the polishing rate at the maintains 202 will be the same as the polishing rate at the valleys 201 during the CMP process, which cannot reduce further the RMS surface roughness.

Then, at this low level of RMS surface roughness where a CMP process cannot further reduce, one more step of CVD process 230 can reduce the RMS surface roughness further. In one embodiment, while dielectric material is deposited at the valleys 201 during the CVD process 230, plasma used to enhance chemical reaction rates of the CVD keeps striking the maintains 202. In other words, the valleys 201 can get more and faster deposited materials than the maintains 202, while the maintains 202 can attract more plasma hits than the valleys 201. In some embodiments, the CVD process 230 is HDPCVD, which includes both a deposition component and a sputtering component during the film deposition. As such, the CVD process 230 will not only increase the total thickness of the dielectric layer, but also reduce the surface roughness of the dielectric layer.

The effect of reducing the surface roughness by a CVD is small and slow when the RMS surface roughness is high. As such, the CVD process 210 will not reduce the surface roughness of the dielectric layer to a desired level until after a very long time. The CVD process 210 stops when the thickness of the dielectric layer reaches a certain degree based on a functional need and/or a customer requirement. In one embodiment, the main purpose of the CVD process 210 is to provide a metal protection layer. If the CVD process 210 stops after the surface roughness of the dielectric layer is reduced to a desired level, e.g. less than 0.5 nm, the thickness of the dielectric layer will be much higher, e.g. more than 10 times higher, than what is needed and requested. That would be a big waste of time, energy, material and money. As such, it is better to utilize the CVD process 230 to reduce the RMS surface roughness when the RMS surface roughness value of the bonding area is below a certain threshold.

The threshold may be determined based on a time when the reduction speed of the RMS surface roughness during a CMP process is low. This threshold may be determined based on the structure and/or the material of the wafer, e.g. related to a density of metal line distribution on the wafer or a thickness of the wafer. In one embodiment, the threshold is about 5 nm. In one embodiment, the threshold is about 1 nm. In one embodiment, the threshold is larger than a size of two water molecules.

In one embodiment, the CVD process 210 and the CMP process 220 may be repeated for several times until the RMS surface roughness threshold is reached. Then, the CVD process 230 is performed as a last step to reduce the RMS surface roughness to the desired level.

Figure 3A:
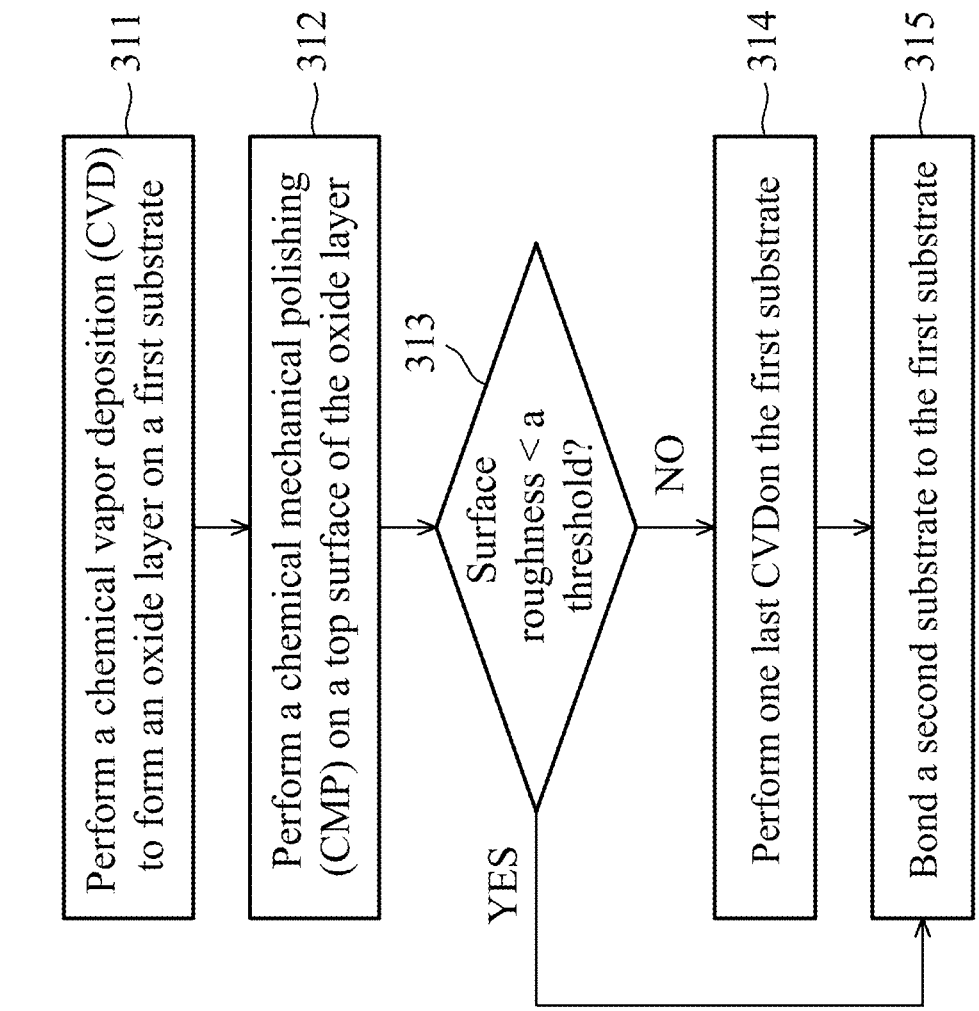
FIG. 3A illustrates a flowchart of a method for improving wafer bonding performance, in accordance with some embodiments of the present disclosure.

FIG. 3A illustrates a flowchart of a method 310 for improving wafer bonding performance, in accordance with some embodiments of the present disclosure. At operation 311, a chemical vapor deposition (CVD) is performed to form an oxide layer on a first substrate. At operation 312, a chemical mechanical polishing (CMP) is performed on a top surface of the oxide layer. At operation 313, it is determined whether the surface roughness of the oxide layer is below a predetermined threshold. If so, the process goes directly to operation 315, where a second substrate is bonded to the first substrate. If not, the process goes to operation 314, where one last CVD is performed on the first substrate to further reduce the surface roughness of the oxide layer; then goes to operation 315, to bond a second substrate to the first substrate. In some embodiments, the predetermined threshold is related to a size of two water molecules. In some embodiments, the predetermined threshold is about 0.552 nm.

Figure 3B:
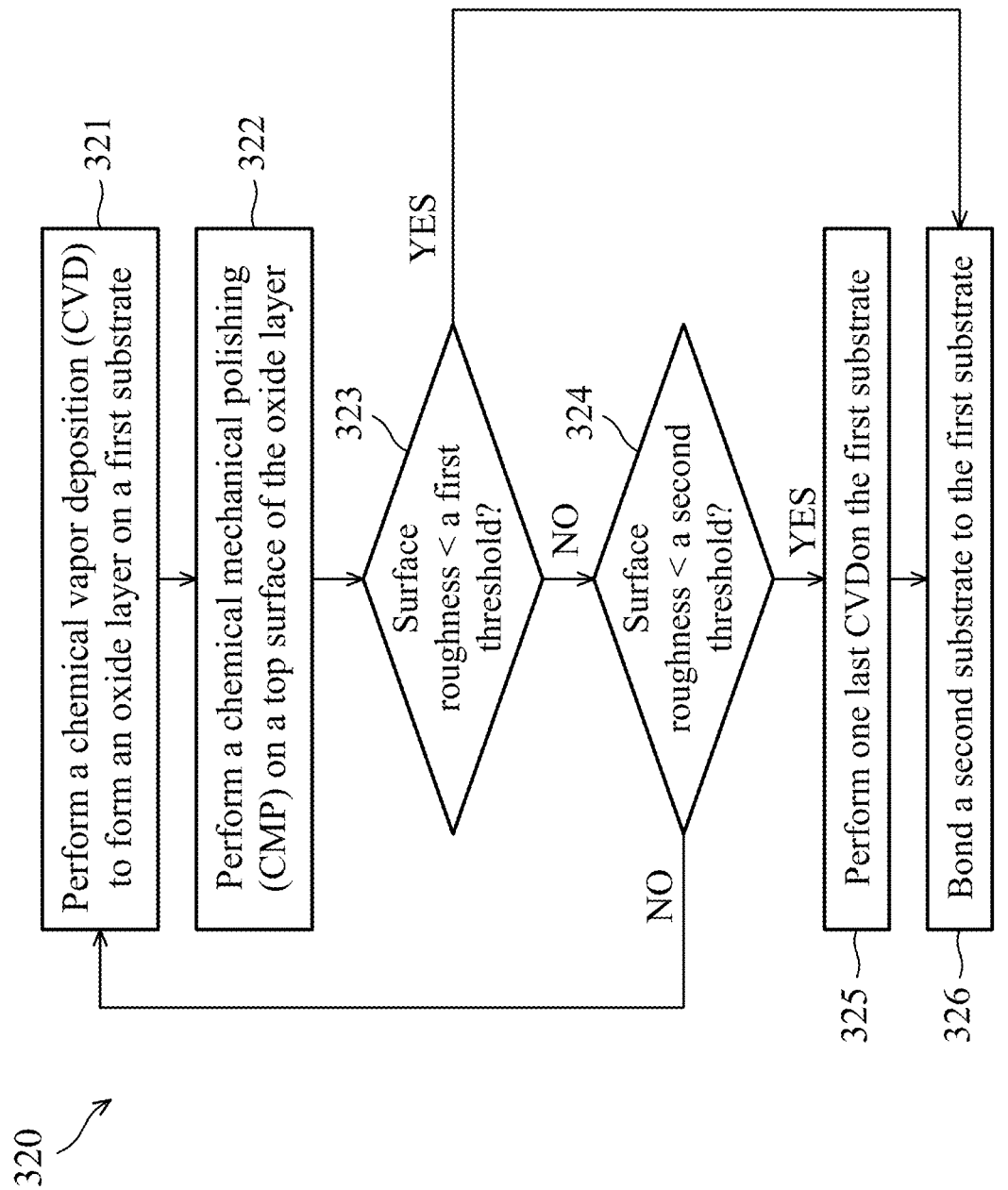
FIG. 3B illustrates a flowchart of another method for improving wafer bonding performance, in accordance with some embodiments of the present disclosure.

FIG. 3B illustrates a flowchart of another method 320 for improving wafer bonding performance, in accordance with some embodiments of the present disclosure. At operation 321, a chemical vapor deposition (CVD) is performed to form an oxide layer on a first substrate. At operation 322, a chemical mechanical polishing (CMP) is performed on a top surface of the oxide layer. At operation 323, it is determined whether the surface roughness of the oxide layer is below a first threshold. If so, the process goes directly to operation 326, where a second substrate is bonded to the first substrate. The first threshold is related to a desired surface roughness level for wafer fusion bonding. In some embodiments, the first threshold is equal to a size of two water molecules, or equal to about 0.552 nm.

If it is determined at operation 323 that, the surface roughness of the oxide layer is not below the first threshold, the process goes to operation 324, to determine whether the surface roughness of the oxide layer is below a second threshold that is larger than the first threshold. The second threshold is close to the desired surface roughness level for wafer fusion bonding, such that when the surface roughness is below the second threshold, one last CVD will bring the surface roughness down below the desired surface roughness level, without causing the oxide layer to be too thick or thicker than a predetermined threshold. When the surface roughness is not below the second threshold, another round of CVD and CMP will be more efficient to bring down the surface roughness. In some embodiments, the second threshold is from 101% to 400% of the first threshold. In other embodiments, the second threshold is from 200% to 300% of the first threshold.

If it is determined at operation 324 that, the surface roughness of the oxide layer is below the second threshold, the process goes to operation 325, where one last CVD is performed on the first substrate to further reduce the surface roughness of the oxide layer; then goes to operation 326, to bond a second substrate to the first substrate. If it is determined at operation 324 that, the surface roughness of the oxide layer is not below the second threshold, the process goes back to operation 321, for another round of CVD at operation 321 and CMP at operation 322. The order of the operations shown in each of FIG. 3A and FIG. 3B may be changed according to different embodiments of the present disclosure.

In one embodiment, the second substrate may be processed following the method 310 or 320 as well, before being bonded to the first substrate. The first and second substrates may be on two wafers of a same kind or of different kinds. For example, one wafer is a MEMS wafer, and the other wafer is a CMOS wafer. The two wafer may be bonded together based on either a fusion bonding or a eutectic bonding. In one embodiment, bonding the two substrates includes: bringing surfaces of the pair of semiconductor substrates in direct contact; and annealing the pair of semiconductor substrates.

Figure 4A:
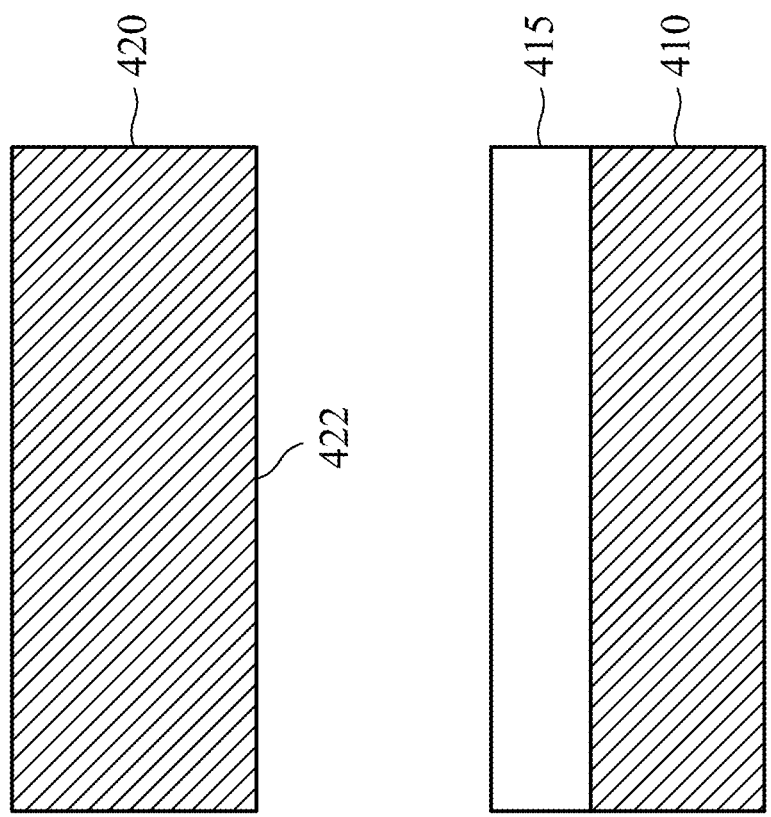
FIG. 4A illustrates cross sectional views of two wafers to be bonded, in accordance with some embodiments of the present disclosure.

FIG. 4A illustrates cross sectional views of two wafers 410 and 420 to be bonded together utilizing the bonding method in accordance with some embodiments of the present disclosure. As shown in FIG. 4A, the wafer 410 includes a dielectric layer 415 formed on a surface thereof; and the wafer 420 includes a surface 422. The dielectric layer 415 may be an oxide layer. In some embodiments the dielectric layer 415 includes silicon oxide (SiOx; x is in a range from 1 to 2). In some embodiments, a deposition rate of the dielectric layer 415 is from about 80 angstrom per second to about 115 angstrom per second. If the deposition rate is smaller than 80 angstrom per second, the manufacturing cycle time increases, resulting in low product output, in some instances. If the deposition rate is greater than 115 angstrom per second, the step coverage of the bonding surface reduces, resulting in high surface roughness, in some instances. Further, in some embodiments, a thickness of the dielectric layer 415 is from about 500 angstrom to about 2000 angstrom. If the thickness is smaller than 500 angstrom, it is insufficient to meet a target surface target roughness value for subsequent boning process, resulting in low film quality control, in some instances. If the thickness is greater than 2000 angstrom, a manufacturing cost increases without significant improvement.

Each of the wafers 410 and 420 may be a semiconductor or an insulator substrate. The wafers 410 and 420 may be composed of the same or different materials. The term "semiconductor" as used herein denotes any semiconducting material including, but not limited to: Si, SiC, SiGe, SiGeC, Si alloys, Ge, Ge alloys, GaAs, InAs, InP as well as other III/V and II/VI compound semiconductors. The term 'semiconductor' also includes silicon-on-insulators (SOI) wherein a buried insulating material, particularly an oxide, separates a top Si-containing layer from a bottom Si-containing layer.

As discussed above, an initial deposition process including, for example, chemical vapor deposition (CVD), low pressure CVD, plasma-enhanced CVD, may be employed in forming the oxide layer 415. The initial deposition process is followed by a polishing process such as chemical mechanical polishing (CMP) or grinding, to thin the previously formed oxide layer. Then, one or more additional pairs of deposition and polishing operations may be performed to control the root mean square (RMS) surface roughness of the oxide layer 415, until the RMS surface roughness is reduced to be smaller than a predetermined threshold. Then, to further reduce the RMS surface roughness to a value suitable for fusion bonding, one more deposition process is performed on the wafer surface.

The surface 422 may be a bare surface, as shown in FIG. 4A, or a surface of an oxide layer. When the surface 422 is a bare surface, one or more polishing processes may be employed on the surface 422 to reduce its RMS surface roughness value. When the surface 422 is a surface of an oxide layer, the same method of wafer processing described above with respect to the oxide layer 415, including deposition and polishing operations and one more deposition process in the end, can be applied to the surface 422 to reduce its RMS surface roughness to a value suitable for fusion bonding.

Then, in some instances, after some processes like cleaning and drying, the surfaces of the two wafers which are to be bonded together, i.e., surface 422 and oxide layer 415, may be brought into intimate contact with one another in an inert ambient. A slight external force may be applied to the wafers 410 and 420 during the contact step and/or during the bonding process. The two wafers 410 and 420 are then bonded by annealing them in the inert ambient.

Figure 4B:
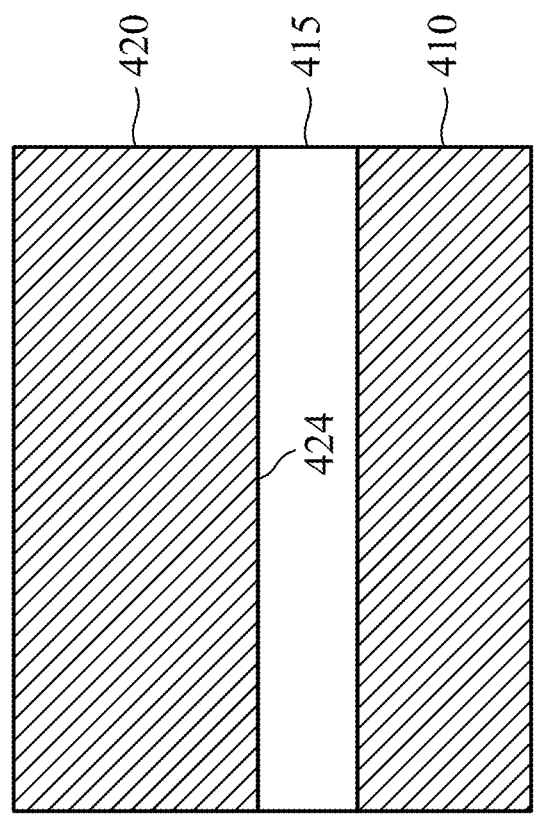
FIG. 4B illustrates cross sectional views of two wafers bonded together, in accordance with some embodiments of the present disclosure.

In accordance with some embodiments of the present disclosure, the resultant bonded wafer pair is shown in FIG. 4B. Specifically, the bonded wafer pair comprises an oxide layer 415 located between the bottom wafer 410 and the top wafer 420. The oxide layer 415 has an interface 424 with top wafer 420. In one embodiment of the present disclosure, the bonded wafer pair shown in FIG. 4B is a silicon-on-insulator that includes the top silicon wafer 420, the oxide layer 415, and the bottom silicon wafer 410. In one embodiment of the present disclosure, the bonded wafer pair shown in FIG. 4B is a substrate material that includes the top silicon wafer 420, the oxide layer 415, and the bottom sapphire wafer 410.

In one embodiment, the top wafer 420 includes a micro-electro-mechanical systems (MEMS) device and the bottom wafer 410 includes a CMOS device. The devices may be bonded together to form a packaged device having a hermetic vacuum environment in micro chambers or cavities between the bonded devices. Based on the disclosed method in the present disclosure, at least one of the two wafer surfaces is pre-processed to have a surface roughness suitable for fusion bonding. This results in a strong bond and a low likelihood of peeling and bond failure, which in turn results in a good wafer yield. Therefore, a lower surface roughness can be achieved by the disclosed methods to improve fusion bonding performances.

In some embodiments, a method for bonding a pair of semiconductor substrates is disclosed. The method includes: processing at least one of the pair of semiconductor substrates, and bonding the pair of semiconductor substrates together. Each of the pair of semiconductor substrates is processed by: performing at least one chemical vapor deposition (CVD), and performing at least one chemical mechanical polishing (CMP). One of the at least one CVD is performed after all CMP performed before bonding.

In some embodiments, a method for bonding a first semiconductor substrate and a second semiconductor substrate is disclosed. The method includes: predetermining a target surface roughness value; measuring a first surface roughness value of the first semiconductor substrate; depositing a first dielectric layer over the first semiconductor substrate when the first surface roughness value is greater than the target surface roughness value; and bonding the first semiconductor substrate to the second semiconductor substrate.

In some embodiments, a method for bonding a complementary metal-oxide-semiconductor (CMOS) wafer with an additional wafer is disclosed. The method includes: processing the CMOS wafer, and bonding the additional wafer onto the CMOS wafer. The CMOS wafer is processed by: repeating a cycle of performing chemical vapor deposition (CVD) followed by chemical mechanical polishing (CMP) until a roughness of a surface of the CMOS wafer is equal to or smaller than a predetermined threshold, and performing a CVD after the repeating.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method comprising:
predetermining a first target surface roughness value and a second target surface roughness value associated with a first semiconductor substrate, wherein the second target surface roughness value is at least twice as large as the first target surface roughness value;
repeating a cycle of performing chemical vapor deposition (CVD) of a dielectric material to form a dielectric layer on a top surface of the first semiconductor substrate followed by chemical mechanical polishing (CMP) on the top surface of the first semiconductor substrate when a roughness of the top surface is larger than or equal to the second target surface roughness value; and
performing an additional CVD of the dielectric material on the top surface of the dielectric layer when the roughness of the top surface is smaller than the second target surface roughness value and larger than or equal to the first target surface roughness value.

2. The method of claim 1, further comprising:
bonding the first semiconductor substrate to a second semiconductor substrate when the roughness of the top surface is smaller than the first target surface roughness value, wherein the second semiconductor substrate is in direct contact with the top surface of the dielectric layer, and wherein bonding the first and second semiconductor substrates comprises:
bringing surfaces of the pair of semiconductor substrates in direct contact; and
annealing the pair of semiconductor substrates.

3. The method of claim 1, wherein the first and second semiconductor substrates are bonded together based on a fusion bonding.

4. The method of claim 1, wherein the at least one CVD is performed based on high density plasma chemical vapor deposition (HDPCVD).

5. The method of claim 1, wherein the first target surface roughness value is smaller than a size of two water molecules.

6. The method of claim 1, wherein the additional CVD is a last step performed during the processing and before the bonding.

7. The method of claim 1, wherein:
a roughness of a surface of the first semiconductor substrate after the processing is smaller than a size of two water molecules.

8. The method of claim 1, wherein:
a roughness of a surface of the first semiconductor substrate after the processing is smaller than about 0.552 nanometer (nm).

9. A method comprising:
predetermining a first target surface roughness value and a second target surface roughness value associated with a first semiconductor substrate, wherein the second target surface roughness value is at least twice as large as the first target surface roughness value;
measuring a first surface roughness value of the first semiconductor substrate;
repeating a cycle of performing chemical vapor deposition (CVD) of a dielectric material to form a first dielectric layer on a top surface of the first semiconductor substrate followed by chemical mechanical polishing (CMP) on the top surface of the first semiconductor substrate when a roughness of the top surface is larger than or equal to the second target surface roughness value; and
performing an additional CVD of the dielectric material on the top surface of the first dielectric layer when the roughness of the top surface is smaller than the second target surface roughness value and larger than or equal to the first target surface roughness value, wherein the first dielectric layer is in direct contact with the first semiconductor substrate.

10. The method of claim 9, further comprises:
measuring a second surface roughness value of the second semiconductor substrate; and
depositing a second dielectric layer over the second semiconductor substrate when the second surface roughness value is greater than the first target surface roughness value and smaller than the second target surface roughness value.

11. The method of claim 9, wherein depositing the first dielectric layer comprises:
depositing a silicon oxide layer at a first growth rate from about 80 angstrom per second to about 115 angstrom per second.

12. The method of claim 9, wherein depositing the first dielectric layer comprises:
depositing a silicon oxide layer to have a first thickness from about 500 angstrom to about 2000 angstrom.

13. The method of claim 9, wherein:
the first target surface roughness value is smaller than a size of two water molecules.

14. The method of claim 9, wherein measuring the first surface roughness value of the first semiconductor substrate comprises:
measuring the first surface roughness value in a bonding area of the first semiconductor substrate.

15. A method comprising:
predetermining a first target surface roughness value and a second target surface roughness value associated with a complementary metal oxide semiconductor (CMOS) wafer, wherein the second target surface roughness value is at least twice as large as the first target surface roughness value;
repeating a cycle of performing chemical vapor deposition (CVD) of a dielectric material on a top surface of the CMOS wafer followed by chemical mechanical polishing (CMP) on the top surface of the CMOS wafer when a roughness of the top surface is larger than or equal to the second target surface roughness value, wherein the dielectric material is in direct contact with the first semiconductor substrate; and
performing an additional CVD of the dielectric material on the top surface of the CMOS wafer when the roughness of the top surface is smaller than the second target surface roughness value and larger than or equal to the first target surface roughness value; and
bonding the CMOS wafer to an additional wafer when the roughness of the top surface is smaller than the first target surface roughness value.

16. The method of claim 15, wherein the additional wafer is a micro electro-mechanical system (MEMS) wafer.

17. The method of claim 15, wherein the CMOS wafer includes a plurality of cavities extending from a bonding surface to a substrate of the CMOS wafer.

18. The method of claim 15, wherein the first target surface roughness value is larger than a size of two water molecules.

19. The method of claim 15, wherein the first target surface roughness value is related to a metal density on the CMOS wafer.

20. The method of claim 15, wherein the first target surface roughness value is related to a thickness of the CMOS wafer.

* * * * *